United States Patent [19]
Hahn et al.

[11] Patent Number: 5,216,289
[45] Date of Patent: Jun. 1, 1993

[54] ASYNCHRONOUS RESET SCHEME FOR ULTRA-LOW NOISE PORT TRI-STATE OUTPUT DRIVER CIRCUIT

[75] Inventors: Michael G. Hahn, Folsom; Joseph H. Salmon, Placerville; Jeffery D. Wilson, Carmichael, all of Calif.

[73] Assignee: Intel Corporation, Santa Clara, Calif.

[21] Appl. No.: 782,680

[22] Filed: Oct. 24, 1991

[51] Int. Cl.⁵ .................... H03K 17/687; H03K 5/13
[52] U.S. Cl. ................................. 307/270; 307/263; 307/451; 307/473; 307/572; 307/596; 307/606
[58] Field of Search ............... 307/270, 263, 571–572, 307/450–451, 443, 605–606, 594, 596, 473

[56] References Cited

U.S. PATENT DOCUMENTS

| | | | |
|---|---|---|---|
| 4,959,565 | 9/1990 | Knecht et al. | 307/473 |
| 4,992,676 | 2/1991 | Gerosa et al. | 307/451 |
| 5,036,232 | 7/1991 | Jungert et al. | 307/448 |

OTHER PUBLICATIONS

IMB Tech. Disc. Bul. vol. 32, No. 8A, Jan. 1990, "Rate of Current Change Controlled Off-Chip Driven with Low Shoot-Through Current".

Primary Examiner—William L. Sikes
Assistant Examiner—Margaret Rose Wambach
Attorney, Agent, or Firm—Blakely, Sokoloff, Taylor & Zafman

[57] ABSTRACT

A circuit for providing digital output signals carrying large amounts of currents without generating large transients at an output terminal connected to a load comprising apparatus for providing gradually increasing amounts of current of a first polarity to the output terminal, apparatus for providing gradually increasing amounts of current of a second polarity to the output terminal, apparatus for utilizing the apparatus for providing gradually increasing amounts of current of a first polarity to the output terminal to place the output terminal at a voltage level required for input signals, apparatus for providing a high impedance path to hold the output terminal at the voltage level required for input signals, and apparatus for disabling the apparatus for providing gradually increasing amounts of current of a first polarity and the apparatus for providing gradually increasing amounts of current of a second polarity to the output terminal.

5 Claims, 5 Drawing Sheets

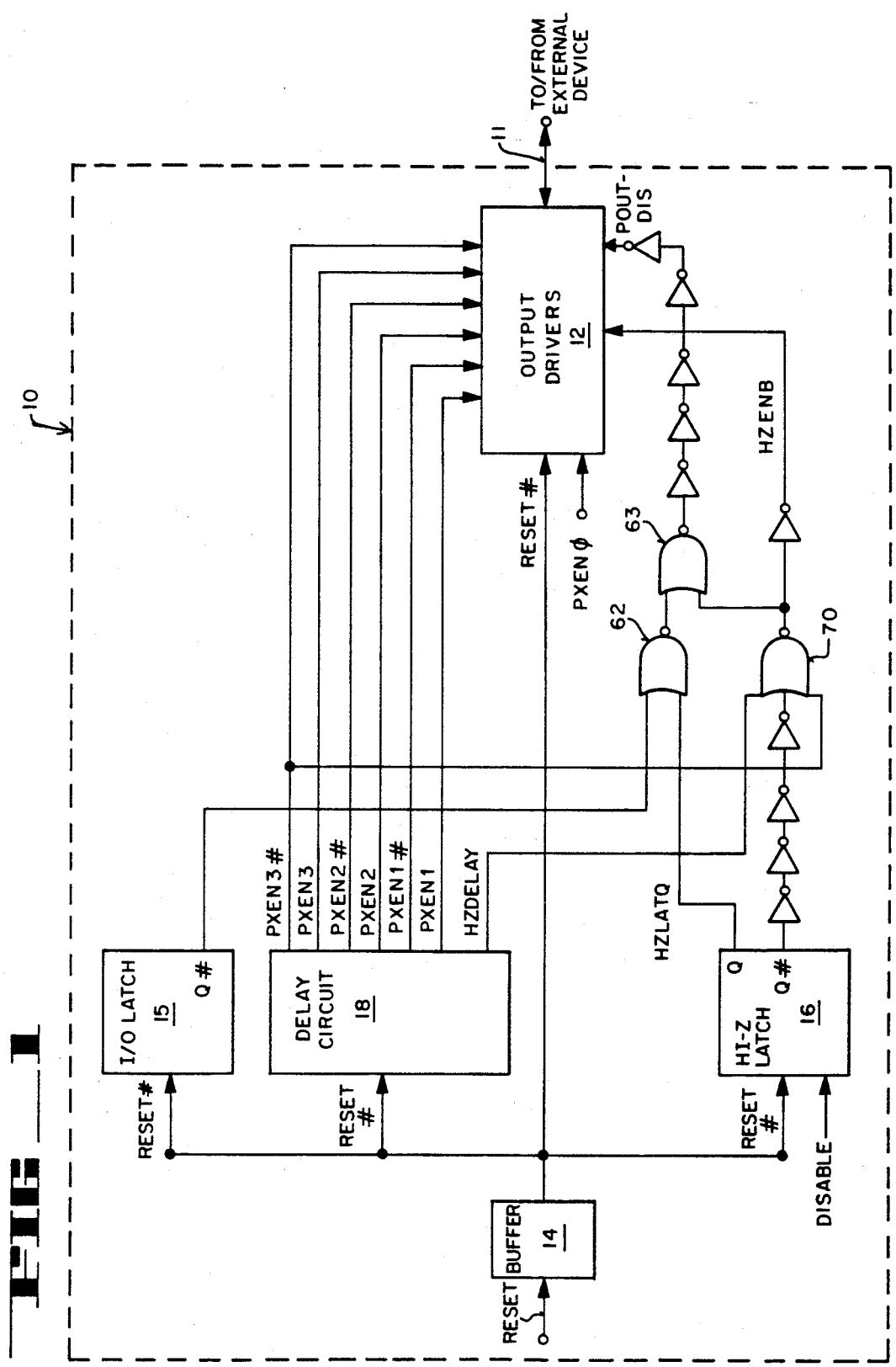

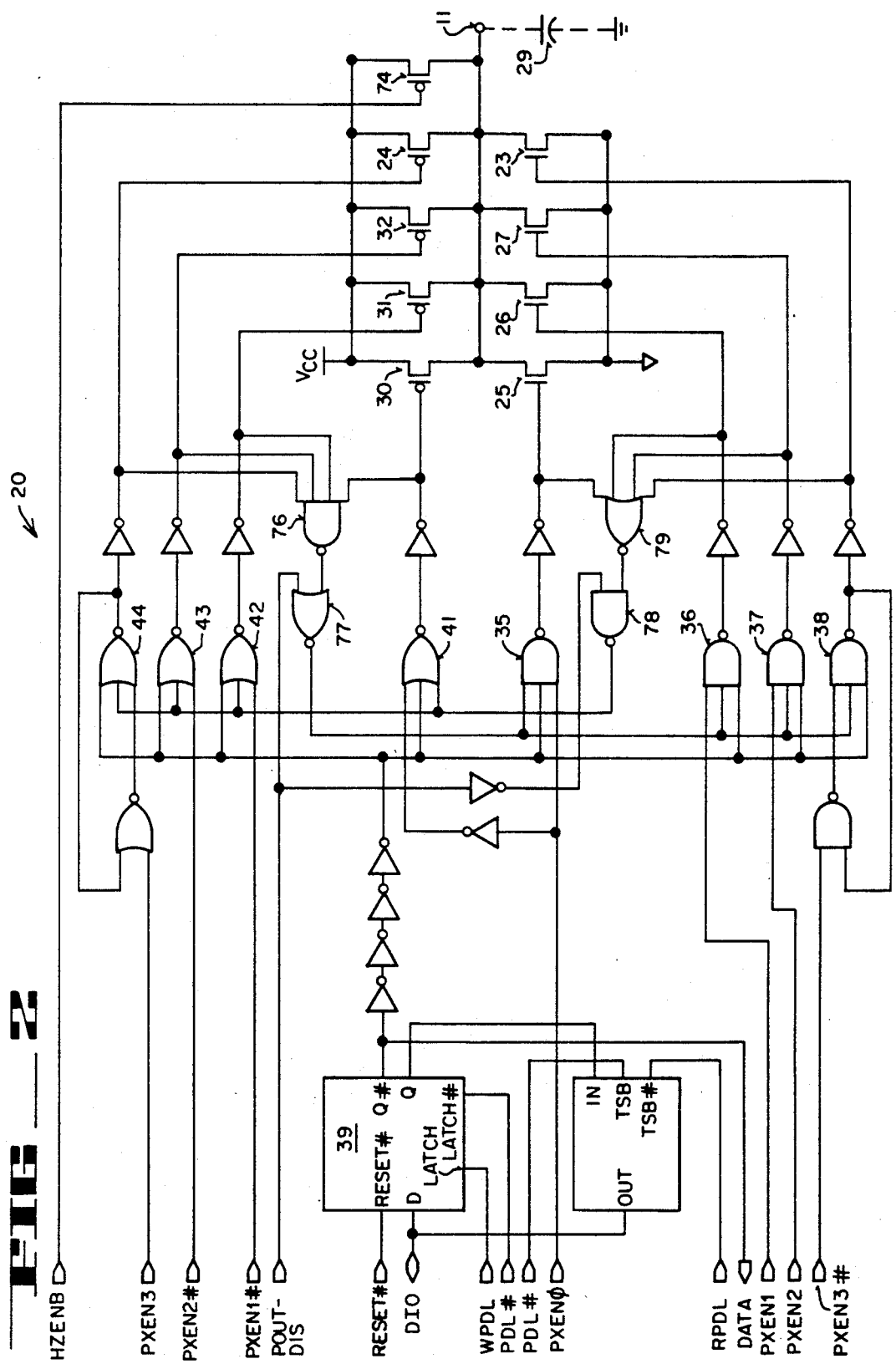
FIG_2

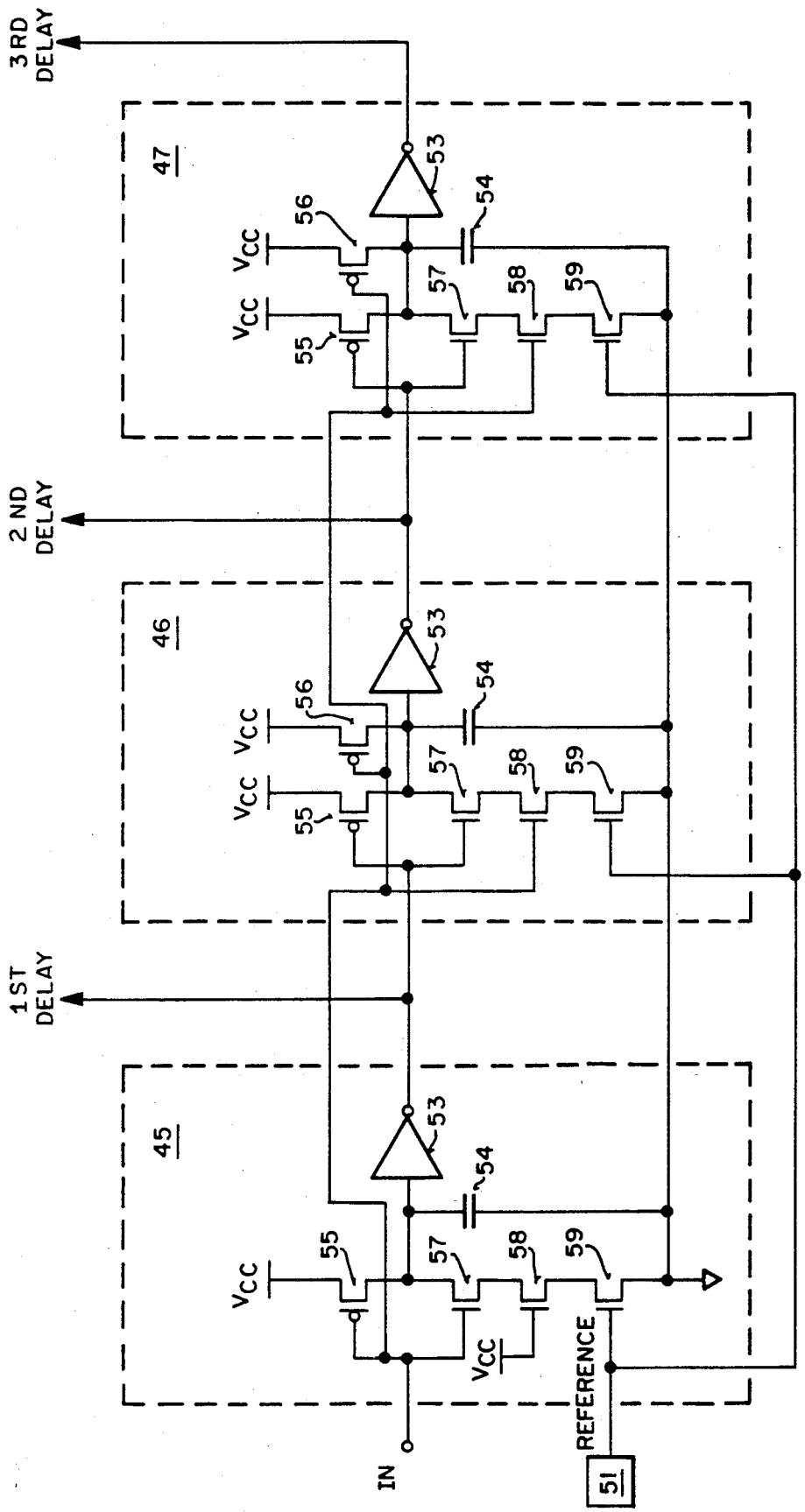
FIG_3

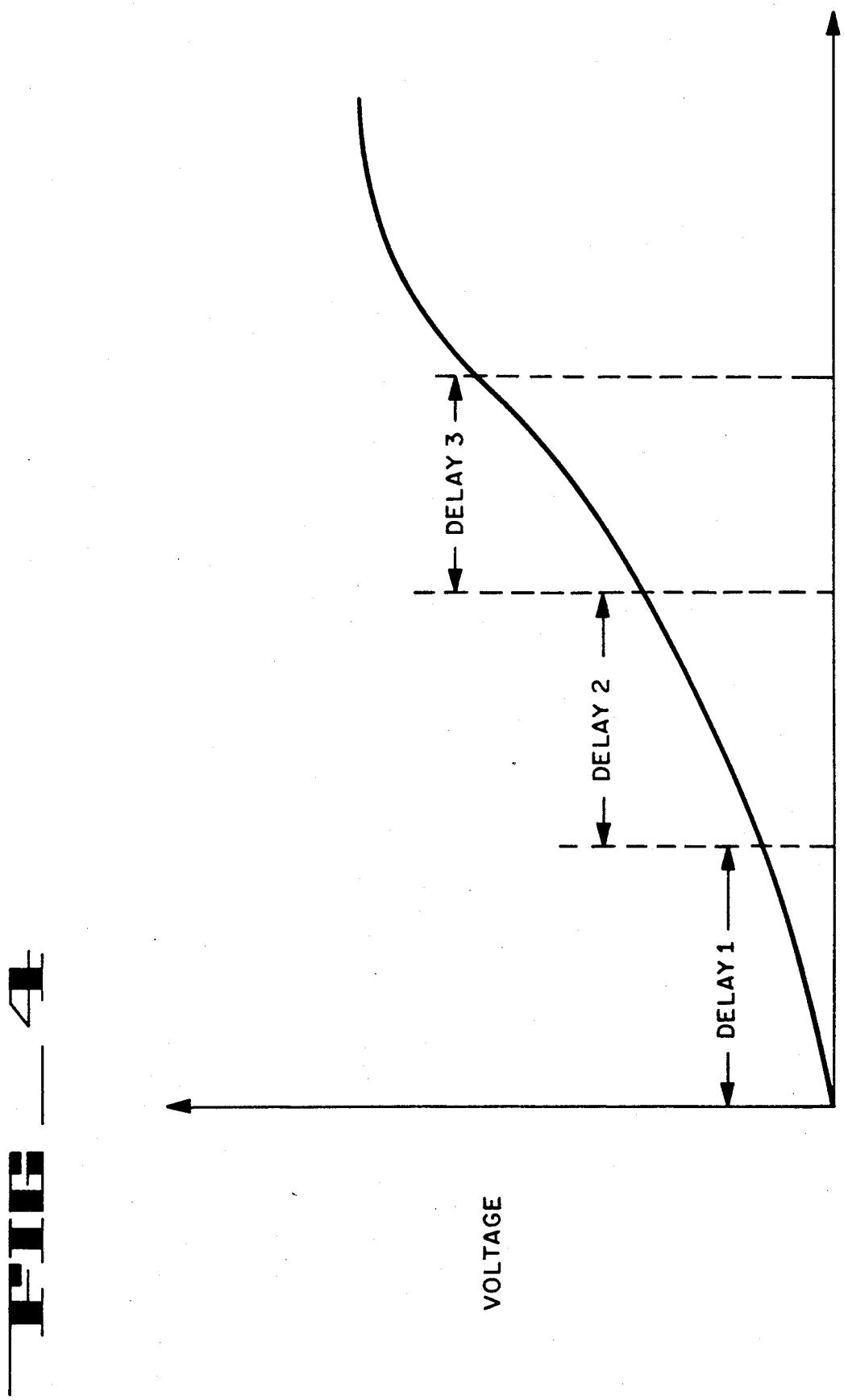

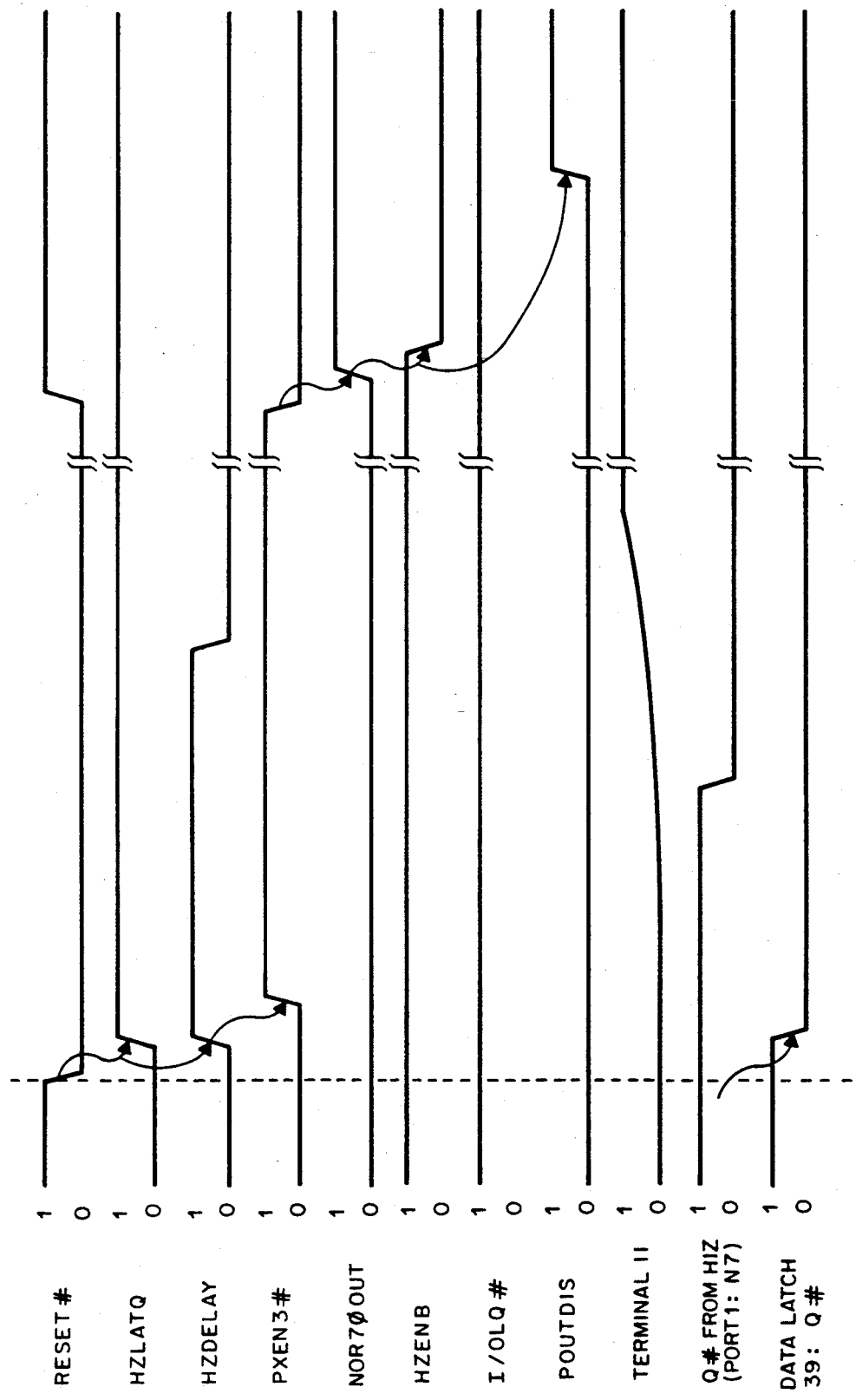

under the PDF page

ASYNCHRONOUS RESET SCHEME FOR ULTRA-LOW NOISE PORT TRI-STATE OUTPUT DRIVER CIRCUIT

BACKGROUND OF THE INVENTION

1. Field of the Invention

This invention relates to port output circuits and, more particularly, to apparatus for resetting the input/output ports of circuitry for switching high current digital signals.

2. History of The Prior Art

Digital circuitry is rapidly replacing mechanical devices and analog circuitry for controlling the operation of equipment. Digital circuits are typically small, operate rapidly, exhibit no signs of wear, and are inexpensive once in quantity production. However, many of the devices which are controlled require amounts of power to operate which are much larger than those typical to digital circuits. Consequently, it is often necessary to provide circuits which are capable of furnishing digital output signals which carry a great deal of current in order to provide the power necessary to operate other devices. Switching these high current output signals to output devices typically generates a high level of transient noise. These transients are often so large that they may interfere with the operation of, or actually damage, the digital circuitry providing the output signals, to circuitry to which the signals are furnished, or any digital circuitry which may be associated therewith.

To overcome this problem, digital buffer circuitry capable of switching high levels of current to an output without producing high levels of noise has been designed. Such circuitry in described in U.S. Pat. application Ser. No. 782,395, entitled ULRTA-LOW NOISE PORT OUTPUT DRIVER CIRCUIT, Hahn et al, filed Oct. 14, 1991, and assigned to the assignee of the present invention.

Not only are digital circuits useful for driving signals to an output, it may also be useful that those circuits respond to input signals generated external to the digital signal generators. To reduce the number of external terminals and for other reasons, it has been found desirable to design such circuits so that the output terminals may be used as input terminals for externally-generated input signals. In view of the fact that the output terminals may carry high current, it is very important that contention between the output signals generated within the digital signal generator and the input signals generated outside the digital signal generator be eliminated. Contentron between these signals might interfere with or even destroy the external circuitry.

SUMMARY OF THE INVENTION

It is, therefore, an object of the present invention to provide circuitry for resetting the condition of the input/output terminals of digital-signal-producing circuitry to eliminate contention between the input and output signals.

It is another, more specific, object of the present invention to provide circuitry for resetting the condition of the input/output terminals of digital-signal-producing circuitry when input is to occur so that the output drivers to the terminals are disabled and the terminals are placed in an input-signal-receiving condition.

These and other objects of the present are realized in a circuit for providing digital output signals carrying large amounts of currents without generating large transients at an output to a load comprising means for providing gradually increasing amounts of current of a first polarity to the output terminal, means for providing gradually increasing amounts of current of a second polarity to the output terminal, means for utilizing the means for providing gradually increasing amounts of current of a first polarity to the output terminal to place the output terminal at a voltage level required for input signals, means for providing a high impedance path to hold the output terminal at the voltage level required for input signals, and means for disabling the means for providing gradually increasing amounts of current of a first polarity and the means for polarity to the output terminal.

These and other objects and features of the invention will be better understood by reference to the detailed description which follows taken together with the drawings in which like elements are referred to by like designations throughout the several views.

BRIEF DESCRIPTION OF THE DRAWINGS

FIG. 1 is a partially-block partially-schematic diagram of circuitry designed in accordance with the present invention.

FIG. 2 is a circuit diagram illustrating in detail a portion of the circuit of FIG. 1.

FIG. 3 is a circuit diagram illustrating in detail a portion of the circuit of FIG. 1.

FIG. 4 is a diagram illustrating wave forms appearing at portions of the circuit of FIG. 1.

FIG. 5 is a timing diagram useful in explaining the operation of the circuit of FIG. 1.

DETAILED DESCRIPTION OF THE INVENTION

Referring now to FIG. 1, there is illustrated a circuit 10 designed in accordance with the present invention. The circuit 10 is used to reset the condition o the output terminals 11 when it is desired to present input signals at those terminals. The output signals are signals representing individual digital states of zero or one which are generated by a circuit 12 illustrated in FIG. 1. The circuit 12 may include a number of individual circuits which may be replicated a number of times (for example, eight) in order to provide bytes (or words or greater quantities of data) simultaneously.

The primary purpose of the circuit 12 is to provide digital output signals capable of driving circuitry requiring substantial levels of current for its operation. To this end, field effect transistor devices are arranged in an integrated circuit to provide first and second voltage levels such as ground and Vcc at the output terminal 11. In order to switch the large amounts of currents required by an output device which may to be connected to the terminal 11 as the load, the devices are designed to provide a substantial current path between the source and drain terminals. For example, the devices can be expected to furnish current values of 2.5 milliamperes at the operational characteristics of a preferred circuit.

As those skilled in the art will recognize, such current levels available at the output from the digital-switching circuitry may and often do deleteriously affect the operation of digital circuits. If these current sources are connected to the terminals 11 when input signals from outside the circuitry 12 become available, the large currents may harm the circuitry providing the input signals.

Consequently, the circuit 10 has been designed in accordance with the present invention to assure that the large current sources provided by the output signals are disconnected from the terminals 11 when input signals are transferred thereto.

To this end, the circuit 10 includes a reset buffer 14 which receives reset signals generated when the terminals 11 are to be switched from output to input terminals. The reset buffer 14 provides reset signals to an input/output latch 15, to a high impedance latch 16, to a data latch within the circuit 12, and to a circuit 18. The input/output latch 15 stores the condition of the output terminals, and the reset pulse resets the latch 15 to indicate that the terminals 11 are to be used as input rather than output terminals. The reset pulse switches the data latch of the circuit 12 to a one (or high) data condition; this condition is used to place the output terminals 11 in the correct condition to receive input pulses. The high impedance latch circuit 16 is used to furnish a high impedance path from the terminals 11 to Vcc so that when the output ports are turned off the output terminals are held at the correct output voltage to receive the input signals. The reset signal initializes the high impedance latch circuit 16 so that after a prescribed delay a high impedance path between Vcc and the terminals 11 may be closed to hold the terminals 11 in the proper condition for the input signals. The circuit 18 provides the requisite delay for placing the output terminals 11 in the correct state to receive input signals. The reset signal accomplishes this by causing the circuit 18 to turn on the output drivers in the circuit 12 sequentially to charge slowly the output terminals 11 to the high voltage condition necessary for input signal, then to close the high impedance latch 16 to maintain this high voltage condition, and finally to switch the output drivers to the off state to remove the high current sources from the output terminals.

The effect of this series of operations is to raise the output terminals 11 to the proper condition to receive input utilizing the low-noise-generating output drivers, to maintain the voltage level for the input condition using a high impedance latch controlling a high impedance field effect transistor, and then to cut off the high current paths furnished by the output buffers. In this manner, the terminals 11 are placed in the proper condition for input without contention for the terminals 11 occurring between input and output signals.

FIG. 2 is a partially-block partially-circuit diagram illustrating a circuit 20 devised in accordance with the present invention. The primary purpose of the circuit 20 is to provide digital output signals capable of driving circuitry requiring substantial levels of current. The circuitry by which this is accomplished and its operation are explained in detail in the patent application entitled *ULTRA-LOW NOISE PORT OUTPUT DRIVER CIRCUIT*, mentioned above. In order to understand the present invention, a summary of that operation is presented here. An N channel field effect transistor device 23 is arranged to provide a first voltage level (such as ground) which may represent a zero at the output terminal 11. A P channel device 24 is arranged to provide a second voltage level Vcc which may represent a one at the output terminal 11. Each of these signals may be selectively furnished to the output terminal 11 in response to signals applied to the gates of the devices. In order to switch the large amounts of currents required by an output device which may to be connected to the terminal 11 as the load, each of the devices 23 and 24 is designed to provide a substantial current path between the source and drain terminals. For example, the N channel device may have a channel width of 105 microns and a channel length of 2.4 microns while the P channel device may have a channel width of 150 microns and a channel length of 2.9 microns. These devices can be expected to furnish current values of approximately 2.5 milliamperes in a preferred circuit.

As those skilled in the art will recognize, such current levels applied at the output from the digital switching circuitry will typically generate very large transient values. These transients may and often do deleteriously affect the operation of digital circuits. Consequently, the circuit 20 has been designed in a manner that the large transients typically generated are eliminated. The circuit generates signals having noise levels several orders of magnitude less than existing low noise buffers.

To accomplish this, the circuit 20 includes a plurality of N channel devices 25, 26, and 27 connected in a manner similar to the device 23 between the first voltage level and the output terminal 11. In a similar manner, the circuit 20 includes a plurality of P channel devices 30, 31, and 32 connected in a manner similar to the device 24 between the second voltage level and the output terminal 11. Each of the devices 25-27 and 30-32 is dimensioned so that it furnishes a relatively weak level of current (approximately 500 microamperes) when conducting. Thus, each of these devices provides a relatively small flow of current when switched to conduction.

Each of these driver devices connected to the terminal 11 has its gate connected to receive input at one stage of a sequence of inputs provided by a delay arrangement. More particularly, when a one is to be furnished at the output terminal 11, input signals are provided in sequence to the gates of the N devices 25, 26, 27, and 23 so that the N device 25 is first turned on and then, sequentially, the other N devices 26, 27, and 23 are turned on after first, second, and third essentially equal delays. In a similar manner, when a one value is to be furnished at the output terminal 11, signals are provided to the gates of the P devices 30, 31, 32, and 24 to turn those devices on in sequential order after preselected equal delays.

Consequently, before either high current device 23 or 24 is turned on to provide a high current path to the output terminal 11, a first device comes on and provides a first low level current path to the output terminal 11 for a first period of time. Current through this path charges (or discharges) a capacitor 29 connected between the output terminal 11 and ground. Then a second device comes on and provides an additional equal low level of current to the output terminal 11. This current adds to the current from the first device charging the capacitor 29 for a second period of time. After the second period, a third device comes on and provides the same low level of current to the output terminal 11 along with the currents from the other devices for a third period of time. Thus, for a period of time selected by the delay circuits, current is provided to the output capacitor 29 so that a voltage builds up thereacross as a gradually increasing ramp function. In the preferred embodiment of the invention, the buildup occurs over a period of approximately 600 microseconds, although this time may be varied to suit the particular load by variations in the parameters of the delay circuits.

Finally, the high current device 23 or 24 for the appropriate digital value is switched on. By this time, however, the capacitor 29 (some portion or all of which may include the inherent capacitance of the load) has charged to a voltage level such that there is little or no voltage drop across the source and drain terminals of the output devices. Thus, when the output device 23 or 24 comes on, there are no significant switching transients produced. The current switched by the device at the output, along with that furnished by the other devices connected to the terminal 11, is sufficient, however, to provide the current drive necessary for the particular load.

To turn on the output devices, a series of NAND gates 35-38 receive the condition of the output data held in a data latch 39 and also receive a series of sequential signals PXEN0, PXEN1, PXEN2, and PXEN3# from the delay circuitry (not shown in this figure). These NAND gates 35-38 provide the signals to the gate terminals to turn on the N devices 25, 26, 27, and 23 and generate the low voltage condition at the terminal 11. A series of NOR gates 41-44 also receive the condition of the output data at the data latch 39 and also receive a series of sequential signals PXEN0#, PXEN1#, PXEN2#, and PXEN3 from the delay circuitry to provide the signals to the gate terminals to turn on the P devices 30, 31, 32, and 24 and generate the high voltage condition at the terminal 11.

In order to provide the delay signals required by the output drivers of the circuit 12, three delay circuits 45-47 are provided. These circuits are illustrated in FIG. 3. Each of these circuits is also described in detail in the patent application entitled *ULTRA-LOW NOISE PORT OUTPUT DRIVER CIRCUIT*, mentioned above, but a summary of the operation is presented here.

Each of the delay circuits 45-47 receives input from a delay reference circuit 51. This circuit 51 is designed to provide a voltage reference level which is independent of the voltage Vcc, the operating temperature, and the process of manufacture. Each of the delay circuits 45-47 includes an inverter 53 having input and output terminals. A capacitor 54 is connected between the input terminal of the inverter 53 and ground. A P channel device 55 is arranged to provide current from a source of voltage Vcc to the capacitor 54. When the capacitor 54 is charged, it places the inverter in a high voltage condition so that a low or zero logic value is provided at its output terminal. Three N channel devices 57, 58, and 59 are connected in series to provide ground at the input terminal of the inverter 53 when they are conducting. The reference voltage from the reference circuit 51 is furnished to the gate of the device 59 and is chosen to maintain the device 59 in the saturation region in which it transfers essentially a constant current. The gates of the devices 55 and 57 each receive the same input signal.

Each of the delay circuits 46 and 47 also includes a P channel device 56 connecting Vcc to the capacitor 54. The gates of the devices 56 and 58 of the two delay circuits 46 and 47 all receive the input signal provided at the gate of the devices 55 and 57 of the first delay circuit 45.

When the input to the gates of the devices 55 and 57 is low (a zero), the device 55 is switched on and the device 57 is switched off. In delay circuit 45, this causes the capacitor 54 to charge through the device 55 to a positive value Vcc. The same low input value turns on the P devices 56 and turns off N devices 58 in each delay circuit 46 and 47 so that the capacitors 54 of all of the delay circuits 45-47 are charged simultaneously. The positive value on the capacitor 54 causes the inverter 53 of each delay circuit to conduct and provide a low (zero) value at its output terminal. This value from delay circuits 45 and 46 is transferred to the input terminals of the next delay circuits 46 causing the devices 55 to conduct. Thus, a zero at the input terminal of the device 55 of the first delay circuit 45 causes the capacitors 54 of all three delay circuits to charge simultaneously and the inverters 53 to produce outputs of zero.

When a one value is received at the gates of the devices 55 and 57 of the first delay circuit 45, the device 55 is switched off and the device 57 is switched on. The devices 57, 58, and 59 of delay circuit 45 then provide a path to ground to discharge the capacitor 54. The reference voltage at the gate to the device 59 controls the amount of current transferred to be relatively constant over the time during which the devices are transferring current prior to the time at which the inverter 53 switches (when the voltage at its input terminal has been reduced to approximately Vcc/2) and provides a one at its output terminal. Since the discharge rate of the capacitor 54 is controlled by the device 59 to be relatively constant, a smooth discharge occurs which is not affected by Vcc, temperature, or process. Thus, the delay provided by the circuit 45 remains relatively constant.

When the device 55 of the first delay circuit switches off, the devices 56 of the circuits 46 and 47 also switch off; and the devices 58 of those circuits switch on. However, there is no discharge path to ground through the devices 57. The capacitors 54 of the delay circuits 46 and 47 remain charged by the current provided by the paths through the devices 55 of the circuits 46 and 47. Thus, those delay circuits 46 and 47 continue to furnish zero values at their output terminals.

When the inverter 53 of the delay circuit 45 switches and provides a one at its output terminal, the device 55 of the second delay circuit switches off; and the device 57 of that circuit switches on, initiating a timed discharge of the capacitor 54 of the second delay circuit. When the voltage on the capacitor 54 reaches the appropriate level, the inverter 53 of the second circuit 46 switches and provides a one at its output. This one, in turn, causes the third delay circuit 47 to begin its timed delay period at the end of which a one is provided at its output terminal. Since the delays are initiated in sequence by essentially identical circuitry, all of the delays are essentially the same.

The present invention utilizes the circuitry just described for furnishing output signals from the circuit 12 of FIG. 1 to assist in accomplishing the resetting of the output terminals 11 when input signals are to be received. Use of this output-signal-generating circuitry places the output terminals 11 in the proper state for receiving the input signals without causing voltage transients which might affect either the input or the output circuitry and without allowing any contention between the input and the output drivers to occur.

Presuming that the port output drivers are "on" and that the terminals 11 are in the low condition, it is desired to enable the output terminals 11 to receive input signals from external circuitry. When the external circuitry signals that it desires to provide an input signal to the circuitry for which the circuitry 12 controls the output terminals, a reset signal is produced generating a RESET# signal (the # indicates the complement of the signal indicated) which goes low. The RESET# signal is furnished to a high impedance latch 16 which assumes a state in which the Q output state goes high producing an output signal HZLATQ. The Q# output state goes low and is furnished through a number of stages of inversion as a low signal at a NOR gate 70. At the same time, the RESET# signal resets an I/O latch 15. When the I/O latch 15 is reset, it generates a zero output signal at its Q# terminal which indicates an input condition. This output signal would normally be propagated to turn off the output drivers. However, the signal HZLATQ furnished by the high impedance latch 16 forces the output of a NOR gate 62 low. The NOR gate 62 normally transfers the output state of the Q# terminal of the I/O latch 15 which controls the condition of the output ports. However, the HZLATQ signal removes the ability of the I/O latch 15 to control this gate during the resetting of the ports from output to input by transferring a zero to the input of a NOR gate 63. This keeps the I/O latch 15 from immediately turning off the output drivers while the output terminals 11 are still in the low condition and terminal contention can occur.

The RESET# signal also resets the data latch 39 of FIG. 2 to a condition that indicates a one is to be furnished to the output. This one data value is used to drive the condition at the terminal 11 to the appropriate (high) condition for receiving input signals without generating any significant amount of noise. To accomplish this, the Q# signal furnished by the data latch is transferred through a number of stages of inversion and by the NOR gate 41 to immediately turn on the first P channel driver 30. This begins to charge the output terminal 11 to the high voltage condition at a very slow rate.

When the reset pulse is applied, the RESET# signal is used to create a charging pulse to initiate the operation of the delay circuit 18. This charging pulse generates a zero condition which is placed on the input terminal to each of the delay circuits 45-47, initiating the charging of those circuits. The zero condition is also transferred from delay circuit 18 as a signal HZDELAY to the NOR gate 70. When the charging pulse is removed from the delay circuits 45-47, the first delay circuit 45 begins to discharge. When the inverter of the first delay circuit 45 switches, the signal PXEN1# is produced causing the second P channel driver 31 to comes on, providing an additional low valued source of current to charge the output terminal 11 to the high condition. The switching of the inverter of the first delay circuit 45 also starts the second delay period of circuit 46. After the delay provided by the circuit 46, the PXEN2# signal is generated causing the next P channel driver 32 to comes on and furnish an equal amount of current. As each new source of current is added, some low level switching transients do occur; however, because the amount of current added is so small, the transients are insufficient to affect the digital circuitry. At this point three times as much current as was initially supplied by the device 30 (but still a minimal amount) is being furnished to charge the output terminal 11.

Finally, after the delay provided by the third delay circuit 47, the signal PXEN3 is generated to turn on the high current driver 24. By the time this occurs, however, the terminal 11 has been charged to a condition at which the switching of the high current driver does not produce noise sufficient to disturb the input and output driver circuits. Consequently, the terminals 11 are now in the high voltage condition at which input signals may be provided. However, before this may occur the output drivers which were used to place the terminals 11 in this condition without generating noise must be disabled so that a high current source does not exist at the terminals 11 which might damage the input circuitry. Moreover, a means must be provided for maintaining the terminals 11 in this high voltage condition after the high current output drivers are turned off.

Since the signal PXEN3 is produced as the output of the third stage of delay to turn on the high current driver 24, it indicates that the output terminals 11 are charged to the high voltage condition. Consequently this signal may be used to accomplish these tasks. The PXEN3 signal and its complement PXEN3# are fed back and accomplish two things. First, the PXEN3# signal generates a zero at the input of the NOR gate 70. It will be recalled that the NOR gate 70 already receives a low (zero) signal from the Q# output of the high impedance latch 16 and a zero signal received as HZDELAY. Consequently, the NOR gate 70 is in a condition so that when it receives the delayed PXEN3# signal, it will generate a one value at its output. Thus, after the delay has transpired and the PXEN3# signal is generated by the delay circuitry and transferred to the NOR gate 70, the gate 70 transfers a one value to its output. This one value is inverted and propagated as a HZENB signal to the gate terminal of the high impedance P channel device 74 connected to terminal 11. The HZENB signal causes the device 74 to conduct and connected Vcc to the terminal 11. The device 74 furnishes a low current, high impedance path to maintain the terminal 11 at Vcc.

The one signal produced at the gate 70 is also transferred to the NOR gate 63 which has been disabled by the HXLATQ signal overriding the I/O latch 15 output signal at the Q# terminal. The gate 63 propagates a POUTDIS signal to the circuit 12. As shown in FIG. 2, the signal POUTDIS is propagated through a NOR gate 77 to turn off all of the N channel drivers (should they have been on) and through a NAND gate 78 to turn off all of the P channel drivers. In this manner, all of the devices capable of providing high current output to the terminal 11 are disabled, and the terminal 11 is maintained in the high condition only by the weak current driver 74.

Although the amount of current provided by the high impedance device is so small that input signals may be provided while that device remains on, typically input circuitry will provide its own arrangement for maintaining the terminal 11 at the proper level. When this is the case, a disable signal may be provided to the latch 16 to terminate the HZENB signal and turn the high impedance device 74 off. Thereafter, the circuit 20 responds to input signals in the normal manner without the necessity of raising the terminal to the high voltage value through the output delay process or turning on the high impedance device 74.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A circuit comprising:

an input/output (I/O) terminal;

an output driver means having a first mode of operation for providing a digital output signal characterized by a large current delivered at said I/O terminal, and a second mode of operation during which an input signal generated by an external device is applied to said I/O terminal;

a means for producing a reset signal which initiates the switching of said output driver means from said first to said second mode of operation;

a delay means responsive to said reset signal for providing a sequence delayed signals, each causing said output driver means to increment current and said I/O terminal such that high potential is achieved at said I/O terminal without large transients;

a means responsive to said reset signal for furnishing a high impedance path from said I/O terminal to an operating potential to maintain said high potential at said I/O terminal; and a means responsive to said reset signal for disabling said digital output signal by disconnecting said large current from said I/O terminal while maintaining said high potential after said high potential has been achieved.

2. The circuit of claim 1 wherein said output driver means comprises a plurality of n-channel field-effect transistors coupled between ground and said I/O terminal, and a corresponding plurality of p-channel field-effect transistors coupled between said I/O terminal and said operating potential, each of said transistors having its gate coupled to receive one of said delayed signals.

3. The circuit of claim 2 wherein said delay means comprises a series of charging circuits each of which includes a capacitor coupled to an inverter, the discharging of said capacitor causing said inverter to switch state thereby producing one of said delayed signals, initiating the discharge of the next capacitor in said series.

4. The circuit of claim 2 wherein said delay means comprises first, second and third inverters coupled in series, each inverter having an associated capacitor coupled to its input, the discharge of the first capacitor causing said first inverter to switch state, thereby producing a first one of said delayed signals and initiating the discharge of the second capacitor, the discharge of said second capacitor causing said second inverter to switch state, thereby producing a second one of said delayed signals and initiating a discharge of the third capacitor, the discharge of said third capacitor causing said third inverter to switch state and produce a third one of said delayed signal.

5. The circuit of claim 3 or 4 wherein said high impedance path means comprises a switching transistor coupled between said I/O terminal and said operating potential, the gate of said switching transistor being coupled to receive said third one of said delayed signal.

* * * * *

UNITED STATES PATENT AND TRADEMARK OFFICE
CERTIFICATE OF CORRECTION

PATENT NO. : 5,216,289
DATED : June 1, 1993
INVENTOR(S) : Michael G. Hanh, Joseph H. Salmon and Jeffrey D. Wilson It is certified that error appears in the above-indentified patent and that said Letters Patent is hereby corrected as shown below:

Col. 1, Line 5     Delete "contentron"     Insert --contention--

Col. 2, Line 1     After the word "output" add --terminal--

Col.2, Line 39     Delete "o"     Insert --of--

Signed and Sealed this

First Day of March, 1994

*Attest:*

BRUCE LEHMAN

*Attesting Officer*     *Commissioner of Patents and Trademarks*